United States Patent
Lou et al.

(10) Patent No.: US 9,612,281 B2
(45) Date of Patent: Apr. 4, 2017

(54) HIGH-SPEED FLIP-FLOP WITH ROBUST SCAN-IN PATH HOLD TIME

(71) Applicant: QUALCOMM Incorporated, San Diego, CA (US)

(72) Inventors: Yi Lou, San Diego, CA (US); Ardavan Moassessi, Laguna Niguel, CA (US); Paul Ivan Penzes, Irvine, CA (US); David Anthony Kidd, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 134 days.

(21) Appl. No.: 14/549,063

(22) Filed: Nov. 20, 2014

(65) Prior Publication Data

US 2016/0146887 A1 May 26, 2016

(51) Int. Cl.
| | | |
|---|---|---|
| *H03K 3/00* | (2006.01) | |
| *G01R 31/3177* | (2006.01) | |
| *G01R 31/317* | (2006.01) | |
| *G01R 31/3185* | (2006.01) | |
| *H03K 3/037* | (2006.01) | |
| *H03K 3/3562* | (2006.01) | |

(52) U.S. Cl.
CPC ... *G01R 31/3177* (2013.01); *G01R 31/31725* (2013.01); *G01R 31/31727* (2013.01); *G01R 31/318541* (2013.01); *G01R 31/318552* (2013.01); *G01R 31/318594* (2013.01); *H03K 3/0375* (2013.01); *H03K 3/35625* (2013.01)

(58) Field of Classification Search
CPC .......... G01R 31/3177; G01R 31/31725; G01R 31/31727
USPC .......................................................... 327/218
See application file for complete search history.

(56) References Cited

U.S. PATENT DOCUMENTS

| | | | |
|---|---|---|---|
| 6,181,179 B1 | 1/2001 | Kanba | |
| 7,274,234 B2* | 9/2007 | Branch | G01R 31/318575 327/202 |
| 7,345,518 B2* | 3/2008 | Branch | G01R 31/318552 327/203 |
| 7,375,567 B2* | 5/2008 | Branch | H03K 3/35625 327/203 |
| 7,650,549 B2* | 1/2010 | Branch | G01R 31/318552 714/724 |
| 7,936,191 B2 | 5/2011 | Hong | |
| 7,992,062 B2 | 8/2011 | Saint-Laurent et al. | |
| 8,352,815 B2* | 1/2013 | Frederick, Jr. | G01R 31/318541 327/202 |
| 8,803,581 B2 | 8/2014 | Chi et al. | |
| 9,130,549 B2* | 9/2015 | Balasubramanian | H03K 3/0372 |
| 2005/0151560 A1 | 7/2005 | Hirata | |
| 2007/0001729 A1* | 1/2007 | Branch | H03K 3/35625 327/202 |

(Continued)

OTHER PUBLICATIONS

International Search Report and Written Opinion—PCT/US2015/056774—ISA/EPO—Jan. 28, 2016.

(Continued)

*Primary Examiner* — Ryan Jager
(74) *Attorney, Agent, or Firm* — Haynes and Boone, LLP

(57) ABSTRACT

A flip-flop is provided that includes a master latch clocked according to a first delay during a normal mode of operation and clocked by a smaller second delay during a scan mode of operation.

23 Claims, 4 Drawing Sheets

(56) References Cited

U.S. PATENT DOCUMENTS

| | | | |
|---|---|---|---|
| 2007/0022339 A1* | 1/2007 | Branch | G01R 31/318552 714/726 |
| 2008/0016417 A1* | 1/2008 | Sinha | G01R 31/31858 714/718 |
| 2011/0016367 A1* | 1/2011 | Tang | G01R 31/318541 714/731 |
| 2014/0298126 A1 | 10/2014 | Sugiyama | |

OTHER PUBLICATIONS

Dillen S.J., et al., "Design and Implementation of Soft-Edge Flip-Flops for x86-64 AMD Microprocessor Modules", Custom Integrated Circuits Conference (CICC), 2012 IEEE, Sep. 9-12, 2012, pp. 1-4.

\* cited by examiner

HIGH-SPEED FLIP-FLOP WITH ROBUST SCAN-IN PATH HOLD TIME

TECHNICAL FIELD

This application relates to flip-flops, and more particularly to a high-speed flip-flop having a robust scan-in path hold time.

BACKGROUND

In a master-slave flip-flop, the master and slave latches are transparent on complementary clock states. For example the master latch may be configured to be transparent (and thus able to latch the incoming data) when the clock is high. The master is then closed when the clock is low. Similarly, the slave latch may be configured to be transparent when the clock is low and closed when the clock is high. Alternatively, the master latch may be configured to transparent when the clock is low whereas the slave latch would then be transparent when the clock is high. In one clock cycle, the master latch thus captures the data on a first clock edge that is then latched by the slave latch in a subsequent second clock edge in the same clocking period. In a serial chain of such flip-flops, the data output from a slave latch in one flip-flop is the data input to the master latch in a subsequent flip-flop. A data bit latched in one flip-flop during a first clock cycle is thus latched in a subsequent flip-flop in a subsequent second clock cycle.

During relatively low-speed operation, the transfer from one flip-flop to a subsequent flip-flop is relatively straightforward as the relatively slow clocking speed provides ample setup timing margins in the timing path coupling the flip-flops. But in a high-speed design, the increased clocking speed makes it difficult for the subsequent flip-flop to capture its data at the clock-triggering edge because the setup time of the flip-flop together with the data propagation delay in the timing path between the flip-flops may approach or exceed the clock cycle period. Moreover, clock jitter reduces the effective time available in the clock cycle for data propagation and setup time. If the jitter, data propagation delay, and setup time together are longer than the clock cycle, the incoming data value will not be properly captured by the subsequent flip-flop. This erroneous operation is denoted as a setup timing failure.

To provide more robust high-speed performance despite clock jitter, it is thus known to provide a flip-flop in which the clocking of the master latch is delayed with respect to the clocking of the slave latch. The delayed clock to the master latch provides sufficient setup margin despite the existence of clock jitter such that the resulting flip-flop may be designated as "jitter-tolerant" (JT) flip-flop. As a result, setup margin (the required minimum amount of setup time) for the JT flip-flop may be reduced although this comes at the cost of an increased hold margin (the required minimum amount of hold time). Although a JT flip-flop is thus robust to clock jitter, the delayed clock to the master latch may cause errors during scan chain formation in the test or scan mode of operation. As known in the test arts (e.g., JTAG), a circuit may be tested by sequentially shifting in a scan-in test vector so that a resulting scan-out vector may be shifted out to determine the presence of circuit errors or defects. But the increased hold margin requirement for the JT flip-flop may result in hold violation during scan mode.

During normal operation, the increased hold margin is not an issue due to the processing delay provided by the logic circuitry coupled between adjacent flip-flops on a timing path. The logic circuitry processes the Q signal from an initial flip-flop into a logic output signal that in turn is re-latched in the subsequent flip-flop on the timing path. The logic circuitry processing provides sufficient delay so that no hold time violations occur. But a scan path has no intervening logic from one JT flip-flop to the next flip-flop in the scan path. The connecting scan paths are fairly short in that the successive JT flip-flops in the scan chain tend to be relatively adjacent to one another on the die. Just like conventional flip-flops, each JT flip-flop would include an input multiplexer that selects between the data input and the scan-in input signal. In normal operation, the input multiplexer selects for the data input signal. However, in scan mode the input multiplexer selects for the scan-in input signal. In a scan chain of JT flip-flops (which may also be denoted as high-speed flip-flops), the input multiplexers are relatively fast such that they cannot provide sufficient delay to prevent the occurrence of hold violations. In particular, a scan-in bit may pass through one JT flip-flop in the scan chain and be registered in the successive JT flip-flop on the same clock edge because of the insufficient hold margin issue. This is plainly undesirable as the successive JT flip-flop is supposed to register its corresponding scan-in signal, not the scan-in signal intended for the preceding JT flip-flop in the scan chain.

Accordingly, there is a need in the art for high-speed flip-flops that retain their jitter tolerant performance during normal operation but are robust to hold scan mode hold violations.

SUMMARY

A high-speed flip-flop is provided with a variable setup time margin for its master latch. The master latch receives a delayed version of the clock during normal operation. In this fashion, the setup time margin for the master latch may be reduced as is conventional for jitter-tolerant high-speed normal mode operation. But the master latch receives a less-delayed version of the clock during a scan mode of operation so that hold violations do not occur in the corresponding scan chain.

These advantageous features may be better appreciated from the following detailed description of example embodiments.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
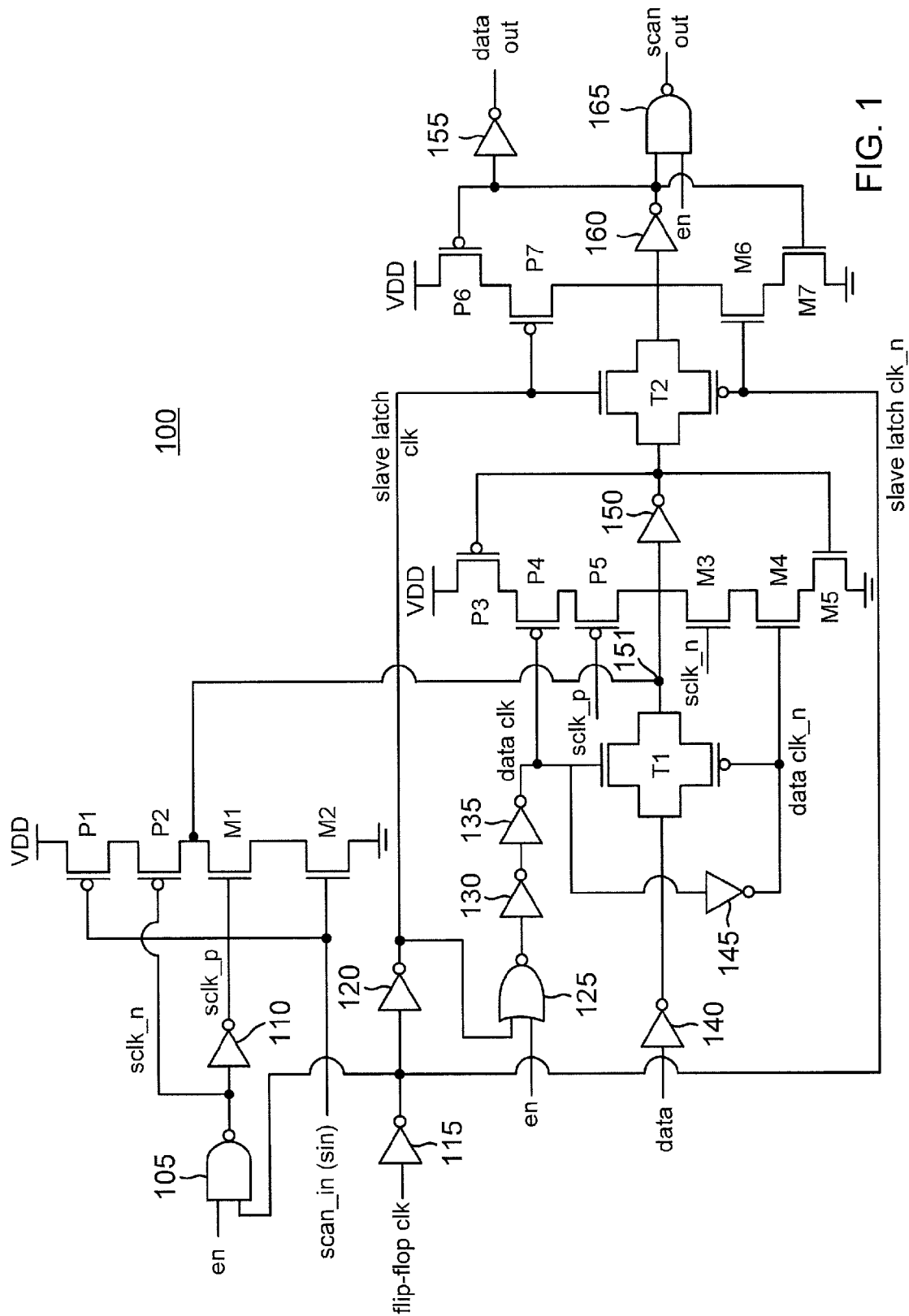
FIG. 1 is a circuit diagram of a flip-flop having a delayed master latch clock during normal operation and having a less-delayed scan-in clock during a scan mode of operation.

A flip-flop is provided that includes a scan-in clock path configured to delay a flip-flop clock signal by a first delay to produce a scan-in clock signal. The scan-in clock path is gated so that the scan-in clock signal is produced responsive to an assertion of a scan mode enable signal during a scan mode of operation. The scan-in clock controls a scan-in signal path that propagates a scan-in signal to a master latch state node responsive to the scan-in clock signal being asserted, which in turn is possible when the scan mode enable signal is asserted. The flip-flop also includes a data clock path configured to delay the flip-flop clock signal by a second delay greater than the first delay of the scan-in clock path to produce a data clock signal responsive to a de-assertion of the scan mode enable signal during normal operation (data mode of operation) of the flip-flip. The data clock controls a data path configured to propagate a data input signal to the master latch state node. This node is responsive to an assertion of the data clock signal, which in turn is only possible while the scan mode enable signal is de-asserted.

Two different clock delays are thus applicable to the delivery of signals to the master latch state node: the first clock delay during scan mode, and the longer second clock delay during normal operation. In this fashion, the master latch has the desired relatively-long second clock delay during normal operation to provide sufficient setup margin, despite the flip-flop clock being relatively high-speed. Conversely, the master latch is clocked by scan-in clock during scan mode so that the master latch has the desired hold margin.

The scan-in and data clock paths may each include a gating logic circuit so that the corresponding clock path is only active during the appropriate mode of operation. In that regard, a single enable signal such as the scan enable mode signal discussed above may control both gating logic circuits. Alternatively, each gating logic circuit may respond to its own independent control signal. For example, the gating logic circuit for the scan-in clock path may respond to the assertion of the scan enable mode signal whereas the gating logic circuit for the data clock path may respond to an assertion of a data mode enable signal. However, it will be appreciated that the respective mode signals would be de-asserted when their corresponding modes of operation are inactive. For example, the scan enable mode signal would be de-asserted during normal operation. It is thus redundant to have two separate enable mode signals such that the following discussion will be directed to just the use of the scan enable mode signal without loss of generality.

The data path and the scan-in paths also include gating circuits that either pass or block the data input signal and the scan-in signal, respectively, in response to the corresponding clock signals being asserted or de-asserted. As known in the master/slave latching arts, the master latch includes a keeper inverter cross-coupled with a second inverter. The master latch state node is the input node to the second inverter. The keeper inverter (which will be denoted herein as just the "keeper" for brevity) includes a plurality of switches responsive to the scan-in clock and the data clock so that keeper inverter is only active when both the scan-in clock and the data clock are de-asserted. It is at this time that the master latch is closed whereas it is transparent when either one of the scan-in clock or the data clock is asserted.

Both the scan-in clock and the data clock are controlled such that they are asserted in response to a de-assertion of the flip-flop clock (when their respective modes are active and subject to the delay of the corresponding clock path). The master latch is thus transparent in response to the flip-flop clock going low. The flip-flop also includes a slave latch that receives the latched signal (either data or scan-in) from the master latch through a slave latch gating circuit such as a slave latch transmission gate. The slave latch transmission gate is controlled by the complementary state of the flip-flop clock in addition to a slave latch keeper such that the slave latch is transparent when the flip-flop clock is high (subject to a buffering delay).

These advantageous features may be better appreciated with regard to an example flip-flop 100 shown in FIG. 1. A data clock path including inverters 115, 120, 130, 135 is driven by a flip-flop clock (flip-flop clk). The data clock path also includes a logic gating circuit such as a NOR gate 125 coupled between inverters 120 and 130 that also NORs a scan mode enable signal (en). The scan mode enable signal en is de-asserted during normal operation such that NOR gate 125 then acts as another inverter in the data clock path. The final inverter 135 in the data clock path produces the data clock (data clk) whenever the scan mode enable signal en is de-asserted (brought low to ground).

When the flip-flop clock is low during normal operation, the data clock will eventually go high due to the odd number of inversions through inverters 115, 120, 130, 135 and NOR gate 125. This high state of the data clock drives the NMOS side of a transmission gate T1 to conduct in a data signal path that receives a data in signal (data) at an inverter 140. The high state of the data clock is also inverted through an inverter 145 to produce an inverted data clock (data clk_n) so that the PMOS side of the transmission gate T1 is also conducting when the data clock goes high after the delay through the data clock path in response to the flip-flop clock going low. The data in signal may then be inverted in inverter 140 and pass through transmission gate T1 to a master latch state node 151, which functions as an input node to a master latch inverter 150. The master latch comprises inverter 150 cross-coupled with a keeper circuit comprising PMOS transistors P3, P4, P5, and also NMOS transistors M3, M4, and M5. Transistors P4, P5, M3 and M4 act as switches that must all be on for the keeper circuit to function as a cross-coupled inverter through the remaining transistors P3 and M5.

The data clock drives the gate of transistor P4 whereas the inverted data clock drives the gate of transistor M4. The master latch keeper is thus off when the data clock is asserted (brought high to a power supply voltage VDD). In contrast, a slave latch that comprises an inverter 160 cross-coupled with a keeper circuit comprising PMOS transistors P6, P7, and also NMOS transistors M6 and M7 is driven by a slave latch clock (slave latch clk) that is a buffered version of the flip-flop clock through inverters 115 and 120. In particular, the slave latch clock signal (slave latch clk) drives the NMOS side of a slave latch transmission gate T2 that couples between the output of master latch inverter 150 and the input to slave latch inverter 160. An inverted slave latch clock (slave latch clk n) from inverter 115 drives the PMOS side of slave latch transmission gate T2 so that transmission gate T2 opens in response to the flip-flop clock going high. The slave latch clock drives the gate of transistor P7 in the slave latch keeper. Similarly, the inverted slave latch clock drives the gate of transistor M6 in the slave latch keeper. The slave latch keeper is thus inactive in response to the flip-flop clock going high so that the slave latch is then transparent. When the slave latch clock goes low in response to the flip-flop clock going low, the keeper then functions as another cross-coupled inverter such that the slave latch is then closed. A scan out output signal from the slave latch is gated by a NAND gate 165 that NANDs the output of slave latch inverter 160 and the scan mode enable en signal.

Conversely, the output of slave latch inverter 160 drives a data out inverter 155 to produce the data output signal during normal operation.

Since the flip-flop clock is inverted five times through inverters 115, 120, 130, 135, and NOR gate 125 to produce the data clock, the data clock is relatively delayed with regard to the flip-flop clock so that the master latch has the desired relatively-small setup requirement during high speed operation. But such a relatively small setup requirement would come at the cost of hold violations in conventional designs during the scan mode. To solve this problem, a scan-in path is provided that allows the required hold time to be reduced during scan mode. For example, the scan-in path may include inverter 115 as well as an inverter 110 and a logic gating element such as a NAND gate 105. NAND gate 105 processes the output of inverter 115 as well as the scan enable mode signal (en). NAND gate 105 thus functions as another inverter during scan mode. Inverter 110 produces the scan clock (sclk_p) that is asserted during scan mode in response to the flip-flop clock going low. The scan clock drives a gate of an NMOS transistor M1. Similarly, an inverted scan clock (sell n) from NAND gate 105 drives the gate of a PMOS transistor P2. Transistors P2 and M1 are thus conducting in response to the scan clock being asserted during scan mode. An inverter is thus formed from a remaining PMOS transistor P1 and a remaining NMOS transistor M2 whose gates are driven by a scan-in signal (sin). The scan-in signal is then inverted during the scan mode to drive the input of master latch inverter 150. To keep the master latch keeper inactive when the scan clock is asserted, the scan clock drives the gate of PMOS transistor P5. Similarly, the inverted scan clock drives the gate of NMOS transistor M6 in the slave latch keeper. The slave latch keeper is thus active when the scan clock goes low in response to the flip-flop clock going low so that the slave latch is then closed. In contrast to the master clock's relatively large delay, the slave latch clock has less delay, which provides a fast output delay from the flip-flop clock to the output node. It will be appreciated that the control shown in FIG. 1 of the master latch keeper by both the data clock and the scan clock with regard to transistors P4, M4, P5, and M3 is just an example embodiment. For example, the scan clock may control transistors P4 and M4 whereas the data clock may control transistors P5 and M3 in an alternative embodiment.

Figure 2:
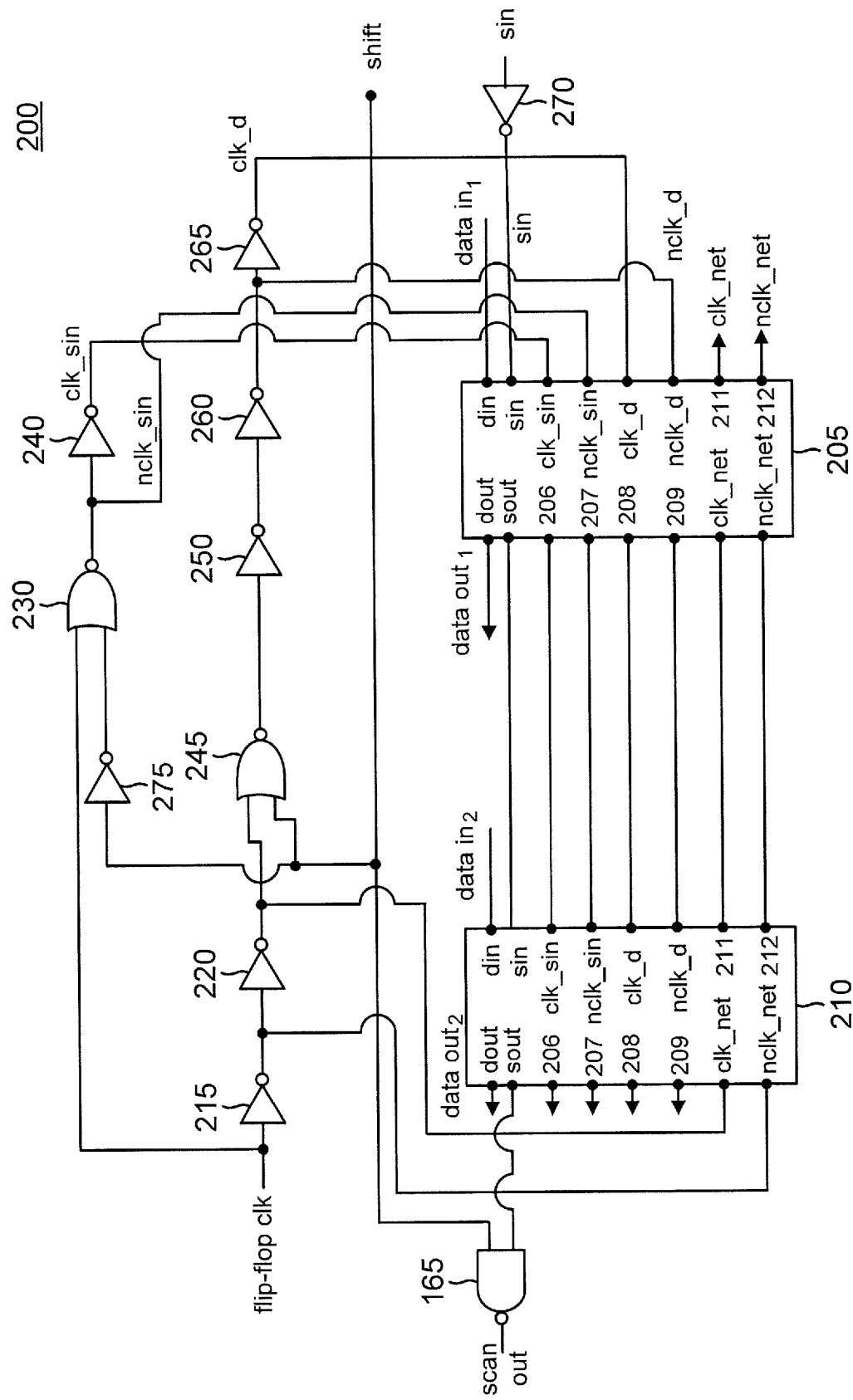
FIG. 2 is a circuit diagram of a plurality of flip-flops sharing a delayed master latch clock during normal operation and sharing a less-delayed scan-in clock during a scan mode of operation.

The scan clock and data clock paths can be shared by multiple registers such as registers 205 and 210 in a system 200 to increase density as shown in FIG. 2. The data clock path is analogous to that discussed with regard to flip-flop 100 in that it includes an inverter 215, an inverter 220, a NOR gate 245, an inverter 250, and an inverter 260 to produce an inverted-data clock (nclk_d) that will be asserted in response to the flip-flop clock (flip-flop clk) going low. NOR gate 245 NORs the output of inverter 220 and a scan mode enable signal (shift). When the shift signal is then de-asserted during normal operation, NOR gate 245 functions as an inverter as did NOR gate 125. An additional inverter 265 in the data clock path produces the delayed data clock (clk_d).

The scan clock path comprises a NOR gate 230 and an inverter 240. Since NOR gate 230 is used in place of NAND gate 105, the scan mode enable signal (shift) is inverted through an inverter 275 before it is processed by NOR gate 230. In this fashion, NOR gate 230 functions as an inverter during the scan mode. Inverter 240 produces the scan clock (clk_sin) whereas NOR gate 230 produces the inverted scan clock (nclk_sin). The scan in signal (sin) is inverted through a scan in inverter 270 to produce an inverted scan in signal that for convenience is also denoted as sin. Each flip-flop such as flip-flops 205 and 210 includes a sin input pin to receive the sin signal as well as a scan out (sout) pin to output the scan output signal. Similarly, each flip-flop includes a clk_sin input pin (or pad) to receive the scan clock and an output pin 206 to output the scan clock, a nclk_sin input pin to receive the inverted scan clock and an output pin 207 to output the inverted scan clock, a data clock (clk_d) pin to receive the data clock and an output pin 208 to output the data clock, and an inverted data clock pin (nclk_d) to receive the inverted data clock as well as an output pin 209 to output the inverted data clock. In the data clock path, inverter 220 produces the slave clock (clk_net) that is received at a corresponding clk_net input pin on register 210 and driven out on an output pin 211 to register 205. Similarly, inverter 215 produces the inverted slave clock (nclk_net) that is received at a corresponding nclk_net input pin on register 210 and driven out on output pin 212 to register 205. Flip-flop 205 has corresponding output pins 211 and 212 for driving the slave clocks to additional registers (not illustrated) that share the same clock paths. The data input signal to flip-flop 205 is denoted as data in$_1$. Similarly, the data input signal to flip-flop 210 is denoted as data in$_2$. Flip-flop 205 captures its input data value (data in$_1$) at the clock triggering edge and outputs its stored data output value (data out$_1$). Similarly, flip-flop 210 captures its input data value (data in$_2$) and outputs its stored data output value (data out$_2$).

Figure 3:
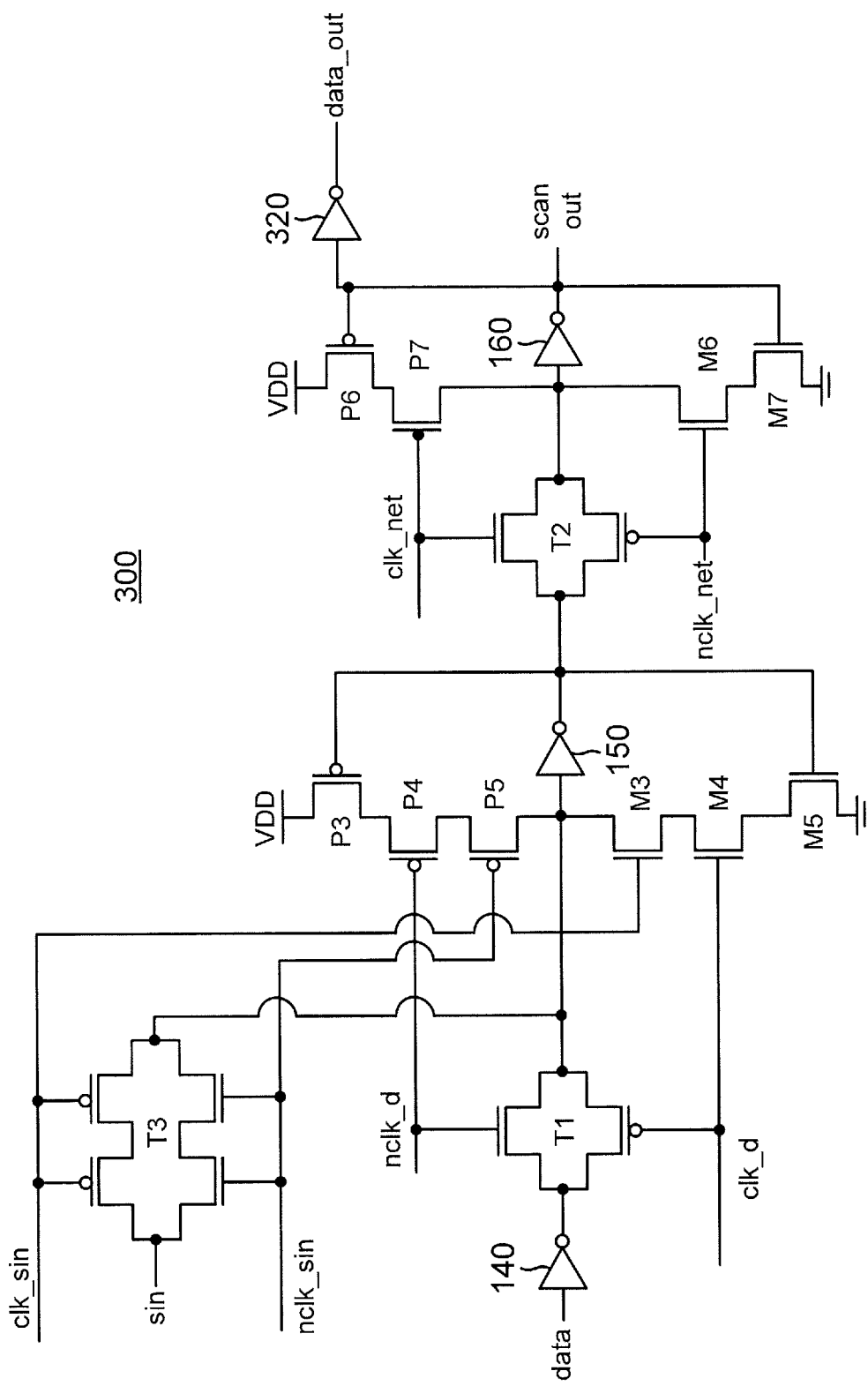
FIG. 3 is a circuit diagram for one of the flip-flops of FIG. 2.

Flip-flops 205 and 210 may be implemented as shown for a flip-flop 300 of FIG. 3. The master latch comprises inverter 150 and the master keeper transistors P3, P4, P5, M3, M4, and M5. A corresponding data path comprises inverter 140 and transmission gate T1 as discussed with regard to flip-flop 100. The slave latch includes inverter 160 driven by transmission gate T2 and slave keeper transistors P6, P7, M6, and M7 as also discussed with regard to flip-flop 100. The scan in signal (sin) is gated though a double transmission gate T3. The use of a double transmission gate reduces the hold requirement on the scan in signal during scan mode but this hold requirement is less than the one produced by the data clock path as discussed above. An inverter 320 inverts the slave latch output signal to drive the dout pin such as discussed for flip-flops 205 and 210. A scan out (sout) pin is driven by the slave latch output.

Figure 4:
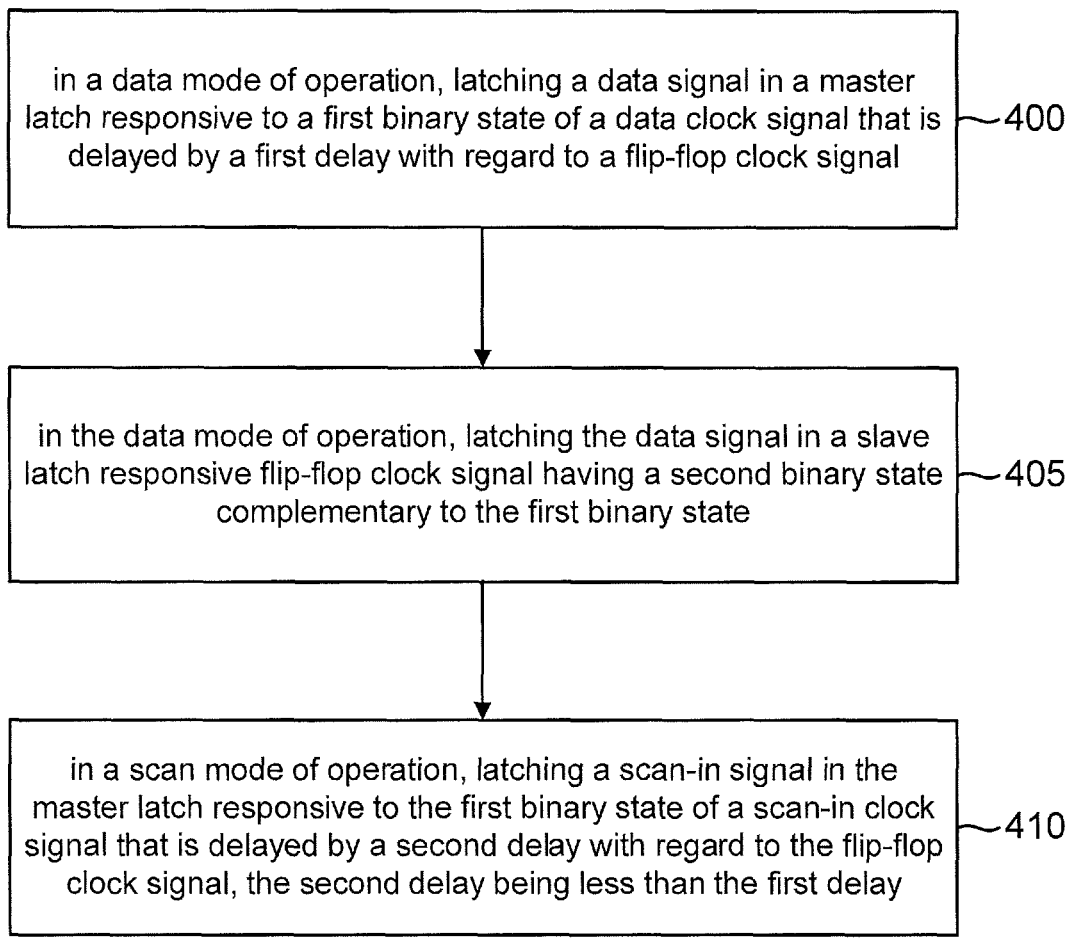
FIG. 4 is a flowchart for an example method of operation for a flip-flop having a delayed master latch clock during normal operation and having a less-delayed scan-in clock during a scan mode of operation.

A method of operating a register having a data clock delay for the master latch that is greater than a scan clock delay is shown in a flowchart in FIG. 4. The method includes an act 400 of, in a data mode of operation, latching a data signal in a master latch responsive to a first binary state of a data clock signal that is delayed by a first delay with regard to a flip-flop clock signal. The latching of the data input signal in the master latch 100 responsive to the high state of the data clock is an example of act 400.

The method also includes an act 405 of, in the data mode of operation, latching the data signal in a slave latch responsive to a second binary state of the flip-flop clock signal, the second binary state being complementary to the first binary state. The latching of the data input signal in the slave latch of flip-flop 100 when the slave latch clock is asserted responsive to an assertion of the flip-flop clock is an example of act 405.

Finally, the method includes an act 410 of, in a scan mode of operation, latching a scan-in signal in the master latch responsive to a first binary state of a scan-in clock signal that is delayed by a second delay with regard to the flip-flop clock signal, the second delay being less than the first delay.

The latching of the scan-in signal in the master latch of flip-flop 100 is an example of act 410. The resulting method is quite advantageous in that the master latch enjoys a sufficiently-reduced setup margin during the data mode but also has a sufficiently-reduced hold margin during the scan mode.

In light of the numerous alternative embodiments discussed above, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A flip-flop, comprising:
   a scan-in clock path configured to delay a flip-flop clock signal by a first delay to produce a scan-in clock signal responsive to an assertion of a scan mode enable signal;
   a scan-in signal path configured to propagate a scan-in signal to a master latch state node responsive to an assertion of the scan-in clock signal;
   a data clock path configured to delay the flip-flop clock signal by a second delay greater than the first delay to produce a data clock signal responsive to a de-assertion of the scan mode enable signal;
   a data path configured to propagate a data input signal to the master latch state node responsive to an assertion of the data clock signal; and
   a master latch including a keeper cross-coupled with a master latch inverter, the master latch state node being an input node to the master latch inverter.

2. The flip-flop of claim 1, wherein the scan-in clock path includes a logic gating circuit configured to open responsive to the assertion of the scan mode enable signal.

3. The flip-flop of claim 2, wherein the logic gating circuit comprises a NAND gate.

4. The flip-flop of claim 1, wherein the data clock path includes a logic gating circuit configured to open responsive to the de-assertion of the scan mode enable signal.

5. The flip-flop of claim 4, wherein the logic gating circuit comprises a NOR gate.

6. The flip-flop of claim 1, wherein the data clock path includes a first plurality of inverters and wherein the scan clock path includes a second plurality of inverters, the second plurality being smaller than the first plurality.

7. The flip-flop of claim 1, wherein the data path includes a transmission gate configured to switch on responsive to an assertion of the data clock signal, and wherein the data clock path is configured so that the assertion of the data clock signal is responsive to a de-assertion of the flip-flop clock.

8. The flip-flop of claim 7, further comprising a slave latch coupled to an output of the master latch inverter through a slave latch transmission gate configured to switch on responsive to an assertion of a buffered version of the flip-flop clock.

9. The flip-flop of claim 7, wherein the transmission gate includes a PMOS transistor having its gate driven by an inverted version of the data clock signal.

10. The flip-flop of claim 9, wherein the transmission gate is configured to drive the master latch state node.

11. The flip-flop of claim 1, wherein the master latch keeper includes a first switch configured to switch off responsive to the assertion of the data clock signal.

12. The flip-flop of claim 11, wherein the first switch comprises a PMOS transistor.

13. The flip-flop of claim 12, wherein the master latch keeper includes a second PMOS transistor configured to switch off responsive to the assertion of the scan clock signal.

14. The flip-flop of claim 1, wherein the scan-in signal path includes an inverter having a PMOS transistor coupled to the master latch state node through a first switch configured to switch off responsive to the assertion of the scan-in clock signal.

15. The flip-flop of claim 1, wherein the scan-in signal path includes a transmission gate coupled to the master latch state node, the transmission gate including an NMOS transistor configured to switch on responsive to the assertion of the scan-in clock signal.

16. The flip-flop of claim 15, wherein the transmission gate comprises a pair of transmission gates in series.

17. A method, comprising:
    in a data mode of operation, latching a data signal in a master latch responsive to a first binary state of a data clock signal that is delayed by a first delay with regard to a flip-flop clock signal;
    in the data mode of operation, latching the data signal in a slave latch responsive flip-flop clock signal having a second binary state complementary to the first binary state; and
    in a scan mode of operation, latching a scan-in signal in the master latch responsive to the first binary state of a scan-in clock signal that is delayed by a second delay with regard to the flip-flop clock signal, the second delay being less than the first delay.

18. The method of claim 17, wherein latching the data signal in the master latch is responsive to the data clock being asserted to a power supply voltage.

19. The method of claim 18, wherein asserting the data clock to the power supply voltage is responsive to the flip-flop clock signal being discharged to ground.

20. A system, comprising:
    a scan-in clock path configured to delay a flip-flop clock signal by a first delay to produce a scan-in clock signal responsive to an assertion of a scan mode enable signal;
    a data clock path configured to delay the flip-flop clock signal by a second delay greater than the first delay to produce a data clock signal responsive to a de-assertion of the scan mode enable signal; and
    a plurality of flip-flops, each flip-flop including a master latch configured to latch a corresponding data signal responsive to an assertion of the data clock signal and to latch a corresponding scan in signal responsive to an assertion of the scan-in clock signal.

21. The system of claim 20, wherein the flip-flops are arranged in a series such that the corresponding scan in signal for a successive one of the flip-flops in the series is a scan out signal from a preceding one of the flip-flops in the series.

22. The system of claim 20, wherein each flip-flop further comprises a scan in transmission gate configured to pass the corresponding scan in signal to the flip-flop's master latch responsive to an assertion of the scan-in clock signal.

23. The system of claim 22, wherein the scan in transmission gate comprises a serially-arranged pair of transmission gates.

* * * * *